United States Patent
Kisler et al.

(10) Patent No.: US 10,969,407 B2
(45) Date of Patent: Apr. 6, 2021

(54) SOFT FRONT PANEL FOR CONCURRENT RADIO FREQUENCY MEASUREMENTS

(71) Applicant: NATIONAL INSTRUMENTS CORPORATION, Austin, TX (US)

(72) Inventors: Matthew D. Kisler, Saint Charles, MO (US); Nigel G. D'Souza, Austin, TX (US); Jon Bellin, Austin, TX (US)

(73) Assignee: National Instruments Corporation, Austin, TX (US)

( * ) Notice: Subject to any disclaimer, the term of this patent is extended or adjusted under 35 U.S.C. 154(b) by 567 days.

(21) Appl. No.: 15/664,396

(22) Filed: Jul. 31, 2017

(65) Prior Publication Data

US 2018/0031609 A1    Feb. 1, 2018

Related U.S. Application Data

(60) Provisional application No. 62/368,877, filed on Jul. 29, 2016.

(51) Int. Cl.
| | |
|---|---|
| *G06F 19/00* | (2018.01) |
| *G01R 13/02* | (2006.01) |
| *G01R 29/08* | (2006.01) |
| *G01R 31/50* | (2020.01) |

(52) U.S. Cl.
CPC ....... *G01R 13/029* (2013.01); *G01R 29/0892* (2013.01); *G01R 31/50* (2020.01)

(58) Field of Classification Search
CPC .......... G01N 2035/00326; G01N 2035/00495; G01N 35/0092; G01R 13/029; G01R 31/50; G01R 29/0892

USPC ......................................... 702/182–185, 199
See application file for complete search history.

(56) References Cited

U.S. PATENT DOCUMENTS

| | | | | |
|---|---|---|---|---|
| 5,530,373 | A * | 6/1996 | Gibson | G01R 13/345 324/115 |
| 6,053,951 | A | 4/2000 | McDonald | |
| 6,219,628 | B1 | 4/2001 | Kodosky | |
| 6,802,053 | B1 | 10/2004 | Dye | |
| 7,136,518 | B2 * | 11/2006 | Griffin | A61B 5/0059 382/133 |
| 2010/0228508 | A1 * | 9/2010 | Smith | G01R 13/02 702/68 |
| 2010/0298718 | A1 * | 11/2010 | Gilham | H04W 16/10 600/484 |

(Continued)

*Primary Examiner* — Regis J Betsch
(74) *Attorney, Agent, or Firm* — Kowert, Hood, Munyon, Rankin & Goetzel, P.C.; Jeffrey Hood; Luke Langsjoen

(57) ABSTRACT

Methods and measurements systems are disclosed relating to use of a soft front panel (SFP) to display results of measurement functions. A measurement device may concurrently perform two or more measurement functions to produce two or more respective signal measurements, wherein each measurement function comprises an acquisition function and a processing function. A computer may be configured to display information on a soft front panel on the display device corresponding to two or more of the signal measurements. The computer may receive, from a user, a selection of an update option, wherein the update option indicates a trigger that causes the displayed information to update. Responsive to receiving an indication that the trigger has occurred, the computer may update the displayed information on the soft front panel.

20 Claims, 5 Drawing Sheets

(56) References Cited

U.S. PATENT DOCUMENTS

| | | | |
|---|---|---|---|
| 2011/0213225 A1* | 9/2011 | Bernstein | A61B 5/1486 600/309 |
| 2013/0245969 A1* | 9/2013 | Singlevich | H01J 37/32917 702/58 |
| 2018/0017608 A1* | 1/2018 | Nithyanandan | H04B 17/0085 |

* cited by examiner

SOFT FRONT PANEL FOR CONCURRENT RADIO FREQUENCY MEASUREMENTS

PRIORITY CLAIM

This application claims priority to U.S. provisional patent application Ser. No. 62/368,877, entitled "Soft Front Panel for Radio Frequency Measurements," filed Jul. 29, 2016, which is hereby incorporated by reference in its entirety as though fully and completely set forth herein.

TECHNICAL FIELD

The present disclosure is related to signal measurements and more particularly to a soft front panel for radio frequency measurements.

DESCRIPTION OF THE RELATED ART

To ensure reliable performance of a product, quality control has become a major part of manufacturing. Therefore, each unit manufactured is tested under a number of conditions to ensure quality. Each test may require a number of instruments to perform a number of measurements and based on the outcome of these measurements, a decision is made to mark the unit as pass or fail. Hence, manufacturing testing plays an important role in ensuring quality products in the marketplace. Manufacturing testing may occur for a plurality of different concurrent measurements, and each measurement may be configured with different measurement configurations. This may present challenges for a user to easily observe and interface with a complex measurement process.

A user that wishes to perform signal measurements may use hardware and software measurement systems to control certain aspects of the signal measurements. One option for interacting with a measurement system is via a user interface, such as soft front panel (SFP), that interacts with a measurement application programming interface (API). For more complex measurement processes involving concurrent measurements, improvements in the design of a soft front panel may be desirable.

SUMMARY

Embodiments described herein relate to systems, memory media, and methods for displaying and updating two or more signal measurements on a soft front panel.

In some embodiments, a measurement device is configured to concurrently perform two or more measurement functions to produce two or more respective signal measurements, wherein each measurement function comprises an acquisition function and a processing function.

In some embodiments, a computer may be coupled to a display device and the measurement device, and may be configured to receive user input. The computer may be configured to display information on a soft front panel on the display device corresponding to two or more of the signal measurements.

In some embodiments, the computer may be configured to receive, from a user, a selection of an update option, wherein the update option indicates a trigger that causes the displayed information to update;

In some embodiments, the computer may be configured to, responsive to receiving an indication that the trigger has occurred, update the displayed information on the soft front panel.

Note that the techniques described herein may be implemented in and/or used with a number of different types of devices, including but not limited to base stations, access points, cellular phones, portable media players, tablet computers, wearable devices, RF semiconductor components, RF power amplifiers, Front End Modules, transceivers, and various other computing devices.

This Summary is intended to provide a brief overview of some of the subject matter described in this document. Accordingly, it will be appreciated that the above-described features are only examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the disclosed embodiments can be obtained when the following detailed description of the preferred embodiments is considered in conjunction with the following drawings.

Figure 1A:
FIG. 1A illustrates a computer system, according to some embodiments.

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

TERMINOLOGY

The following is a glossary of terms used in the present document.

Device Under Test (DUT)—A physical device or component that is being tested.

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as signals such as electrical, electromagnetic, or digital signals, conveyed via a communication medium such as a bus, network and/or a wireless link.

Multiprocessor System—a computer system that includes multiple processing elements, i.e., processors, processing cores, or even networked computers, that may operate in a coordinated manner to execute program instructions concurrently.

Concurrently—a manner of performing actions or processes such that at least a portion of the (concurrent) processes overlap in time, e.g., at least one of the processes executes at least one iteration while another process executes an iteration. Concurrence, as used herein, may be accomplished in any of multiple ways, including through the use of single processor systems, e.g., via multi-threading, time-slices, etc., or multiprocessor (or multicore) systems, as well as any other technique for processing functions at the same time.

Function—a discrete set of one or more steps that form at least a part of a process.

Acquisition—refers to the acquiring of analog signals and converting the analog signals to digital data, e.g., bits.

Measurement Data Sets—the digital data resulting from an acquisition, including the "raw" digital bits and/or the digital bits converted via some scaling to any of a variety of formats, including voltages and other engineering units.

Programmable Hardware Element—includes various types of programmable hardware, reconfigurable hardware, programmable logic, or field-programmable devices (FPDs), such as one or more FPGAs (Field Programmable Gate Arrays), or one or more PLDs (Programmable Logic Devices), such as one or more Simple PLDs (SPLDs) or one or more Complex PLDs (CPLDs), or other types of programmable hardware. A programmable hardware element may also be referred to as "reconfigurable logic".

Medium—includes one or more of a memory medium, carrier medium, and/or programmable hardware element; encompasses various types of mediums that can either store program instructions/data structures or can be configured with a hardware configuration program.

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Graphical Program—A program comprising a plurality of interconnected nodes or icons, wherein the plurality of interconnected nodes or icons visually indicate functionality of the program.

Data Flow Graphical Program (or Data Flow Diagram)—A graphical program or diagram comprising a plurality of interconnected nodes, wherein the connections between the nodes indicate that data produced by one node is used by another node.

Graphical User Interface—this term is intended to have the full breadth of its ordinary meaning. The term "graphical user interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window, panel, or dialog box having one or more GUI Elements, or may comprise a plurality of individual GUI Elements (or individual windows each having one or more GUI Elements), wherein the individual GUI Elements or windows may optionally be tiled together.

Graphical User Interface Element—an element of a graphical user interface, such as for providing input or displaying output. Exemplary graphical user interface elements include input controls and output indicators.

Input Control—a graphical user interface element for providing user input to a program. Exemplary input controls include buttons, check boxes, input text boxes, knobs, sliders, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are operable to acquire and/or store data from a DUT. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

User Equipment (UE) (or "UE Device")—any of various types of computer systems devices which are mobile or portable and which performs wireless communications, such as mobile wireless devices. Examples of UE devices include mobile telephones (e.g., cellular telephones ("cell phones")) or smart phones (e.g., iPhone™, Android™-based phones), portable gaming devices (e.g., Nintendo DS™ PlayStation Portable™, Gameboy Advance™, iPod™), laptops, tablets (e.g., iPad™, Android™-based tablets), PDAs, portable Internet devices, music players, data storage devices, or other handheld devices, etc. In general, the term "UE" or "UE device" can be broadly defined to encompass any electronic, computing, and/or telecommunications device (or combination of devices) which is easily transported by a user and capable of wireless communication.

DETAILED DESCRIPTION

FIG. 1A: Computer System

FIG. 1A illustrates a computer system 82 configured to implement various embodiments. More specifically, the computer system 82 may be configured to execute one or more programs, e.g., one or more graphical data flow programs, to execute a measurement function (for example, in some embodiments, to test one or more devices under test (DUTs)), where the measurement function may include an acquisition sequence and a processing sequence, and wherein results of the measurement function may be displayed on a soft front panel, as described below in detail.

As shown in FIG. 1A, the computer system 82 may include a display device. In some embodiments, the computer system 82 may be configured to display a (possibly graphical) program as the program is created and/or executed. The display device may also be configured to display a graphical user interface or soft front panel of the program during execution of the program. The graphical user interface may comprise any type of graphical user interface, e.g., depending on the computing platform.

The computer system 82 may include at least one memory medium on which one or more computer programs or software components according to one embodiment may be stored. The memory may be coupled to one or more processors and store program instructions executable by the one or more processors. For example, the memory medium may store one or more programs, e.g., graphical programs, which are executable to perform embodiments of the methods described herein. Additionally, the memory medium may store a programming development environment application used to create and/or execute such programs. The memory medium may also store operating system software, as well as other software for operation of the computer system. Various embodiments further include receiving or storing instructions and/or data implemented in accordance with the foregoing description upon a carrier medium.

Figure 1B:
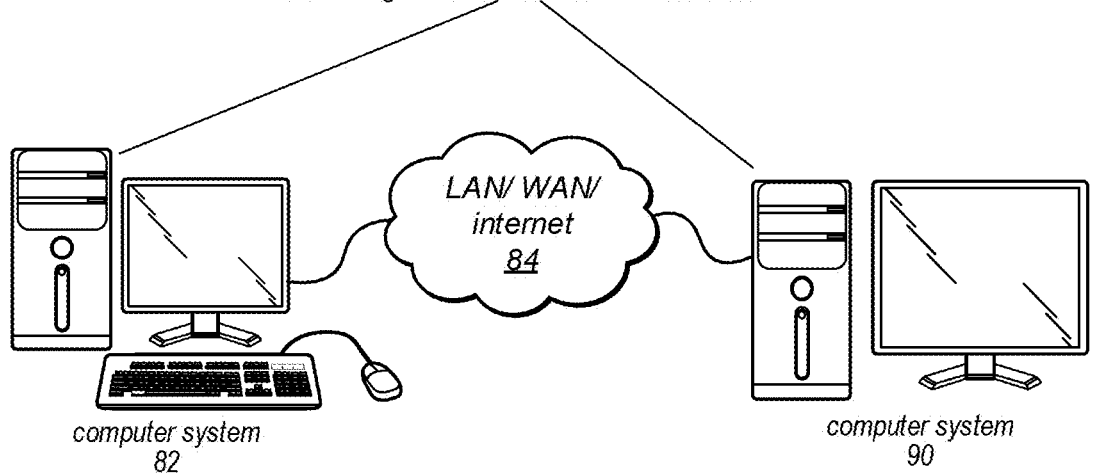
FIG. 1B illustrates a network system, according to one embodiment.

FIG. 1B: Computer Network

FIG. 1B illustrates a system including a first computer system 82 that is coupled to a second computer system 90. The computer system 82 may be coupled via a network 84 (or a computer bus) to the second computer system 90. The computer systems 82 and 90 may each be any of various types, as desired. The network 84 can also be any of various types, including a LAN (local area network), WAN (wide area network), the Internet, or an Intranet, among others. The computer systems 82 and 90 may execute programs, e.g., one or more graphical programs, in a distributed fashion. For example, computer 82 may execute a first portion of the block diagram of a graphical program and computer system 90 may execute a second portion of the block diagram of the graphical program. As another example, computer 82 may display the graphical user interface of a graphical program and computer system 90 may execute the block diagram of the graphical program.

In one embodiment, the graphical user interface of the program and a soft front panel may be displayed on a display device of the computer system 82, and the block diagram may execute on a device coupled to the computer system 82. The device may include a programmable hardware element and/or may include a processor and memory medium which may execute a real time operating system. In one embodiment, the program may be downloaded and executed on the device. For example, an application development environment with which the program is associated may provide support for downloading a program for execution on the device in a real time system. It should be noted that while various embodiments are described herein in terms of a graphical program implementation, any other types of programs or programming technologies may be used as desired.

Figure 2:
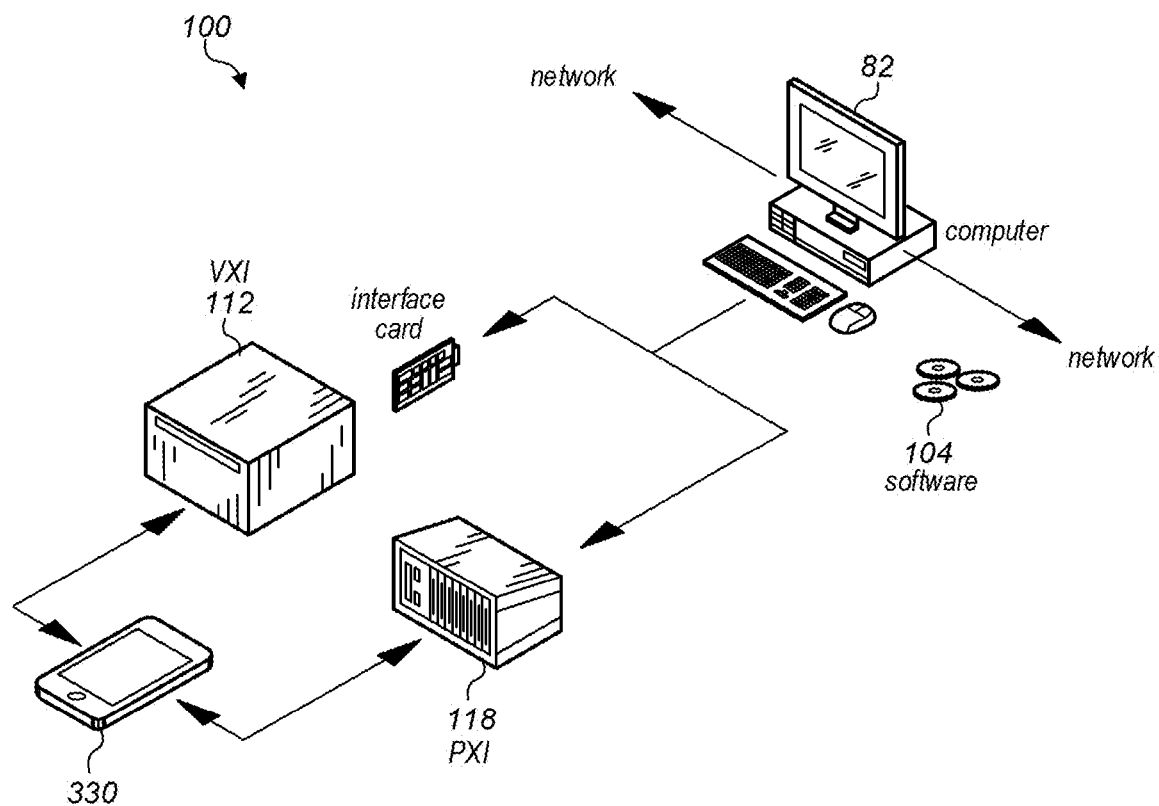
FIG. 2 is a schematic diagram showing a typical measurement setup, according to some embodiments.

FIG. 2—Exemplary Measurement System

FIG. 2 illustrates an exemplary measurement system that is configured to employ embodiments presented herein. A computer 82 may be used by a user to conduct the delay measurement process, and may be connected to a network and to the measurement apparatus. Software 104 may be installed on the computer to conduct the delay measurement process. The computer 82 may be connected to any of a variety of signal generating apparatuses, according to various embodiments. For example, the computer may be connected to a PXI 118 with configurable interface cards. Alternatively or additionally, the computer may be connected to a VXI 112 that is configured with interface cards. The PXI 118 and/or the VXI 112 may serve as waveform generators to supply a signal to the Device Under Test (DUT) 330. The VXI and/or PXI may further function as a vector signal analyzer (VSA), to receive and analyze an output signal from the DUT. The DUT may be any of a variety of electronic devices for which a measurement function is desirable. It should be noted that a DUT may be any of various types of computer systems devices which are mobile or portable and which performs wireless communications, such as mobile wireless devices. Examples of DUTs include mobile telephones (e.g., cellular telephones ("cell phones") or smart phones, portable gaming devices, laptops, tablets, PDAs, portable Internet devices, music players, data storage devices, or other handheld devices, etc. In general, the term "UE" or "UE device" can be broadly defined to encompass any electronic, computing, and/or telecommunications device (or combination of devices) which is easily transported by a user and capable of wireless communication.

In some embodiments, the signal generator and/or signal analyzer may be comprised within the computer 82, which may be directly connected to the DUT 330. A soft front panel, according to embodiments described herein, may be configured to display on a display device of the computer 82 (e.g., on a monitor or other display device).

In some embodiments, separate devices may be used to perform some of the functions (e.g. the AWG, VSG, VSA, etc.) described above. These dedicated devices, which may be known in the art as "box" type instruments, may also be connected to a computer system. In some embodiments, the connected computer system may be configured to receive outputs from or provide inputs to the dedicated instruments. The connected computer system may also, in some embodiments, collect and store data or display outputs from the devices.

In one embodiment, the system may include a memory, e.g., a non-transitory computer accessible memory medium, coupled to one or more processors, where the memory stores program instructions which may be executable by the one or more processors to implement embodiments of the testing method disclosed herein. For example, in one embodiment, the program instructions may be executable to provide a test sequence. The test sequence may include an acquisition sequence and a processing sequence. The acquisition sequence may include a sequence of acquisition functions for performing acquisitions on one or more DUTs, such as UE devices 514a-514d. The processing sequence may include a sequence of processing functions for processing measurement data resulting from the acquisitions.

In one embodiment, at least one processing function of the processing sequence may be performed concurrently with at least one acquisition function of the acquisition sequence. It should be noted that, as defined above, concurrently means that at least a portion of the (concurrent) processes overlap in time. Alternatively, in one embodiment the execution of the acquisition sequence and the processing sequence may be completely separate (temporally), where the acquisition sequence may be completed prior to any processing function being performed.

Figure 3:
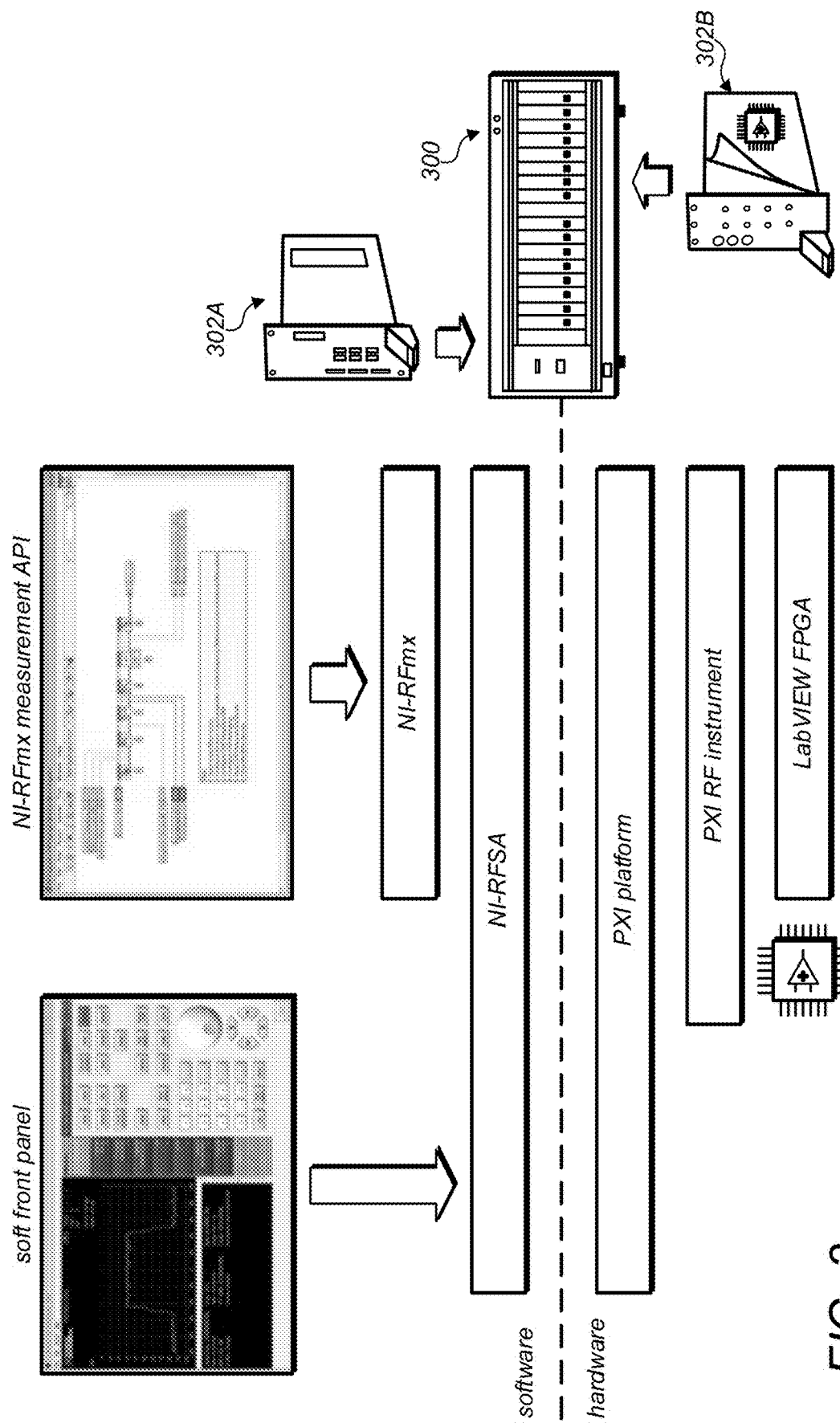
FIG. 3 illustrates an example measurement system, according to some embodiments.

FIG. 3—Example Measurement System with Soft Front Panel

FIG. 3 illustrates an example measurement system, according to some embodiments. The measurement system may include software features, such as a soft front panel (SFP) that may communicate with a measurement application programming interface (API) (e.g., a NI-RFmx measurement API as shown in the illustrated example) through a signal analyzer (e.g., a NI-Radio Frequency Signal Analyzer, or NI-RFSA, as shown in the illustrated example). The measurement system may additionally include hardware features, such as a PCI extensions for instrumentation (PXI) platform 300, a PXI radio frequency (RF) instrument 302A, and a LabVIEW field-programmable gate array (FPGA) 302B. FIG. 3 additionally illustrates that the PXI platform may be a instrument chassis 300 that may include one or more hardware modules, such as a PXI RF instrument 302A or an FPGA 302B. Note that the software and hardware listed above and/or depicted in FIG. 3 are examples only, and aspects of the present disclosure may be implemented on other hardware and software systems.

The API may include one or more features that may be exposed by the SFP. For example, in monitoring mode, a SFP may display the configuration and results for measurements that are being executed in an automated test program running in a different process. Monitoring mode may typically be used when the automated test program is executing and not stopped at a breakpoint. However, monitoring mode may also be used when a user is stepping through their automated test code; allowing a user to see the configuration and results without having to manually switch into and out of Local mode at each step.

Figure 4:
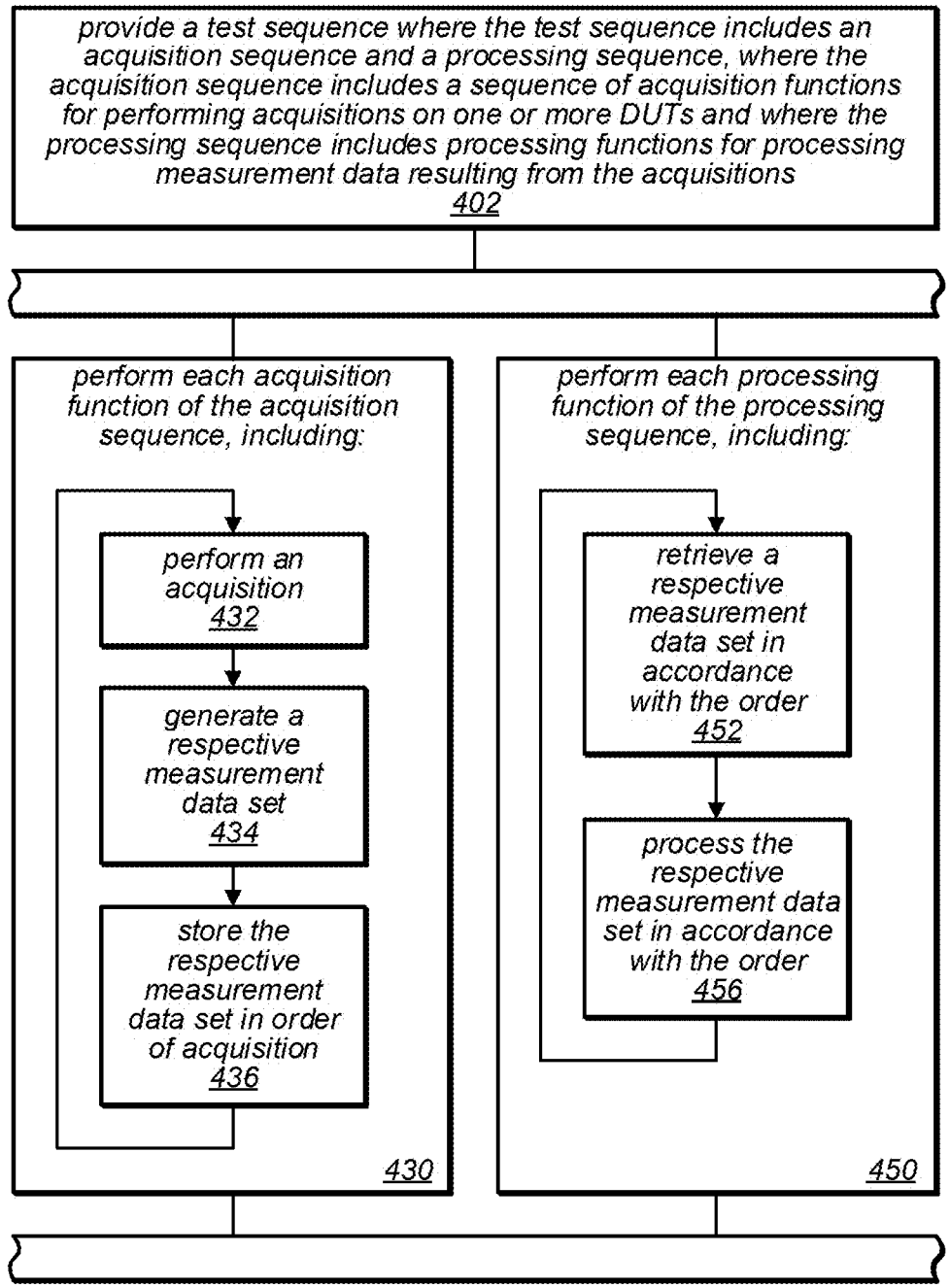
FIG. 4 is a flow chart diagram that illustrates a method for performing multiple concurrent measurements, according to some embodiments.

FIG. 4: Flowchart of a Method for Testing DUTs

FIG. 4 is a flowchart diagram of a method for implementing or performing a measurement function on DUTs. The method shown in FIG. 4 may be used in conjunction with any of the computer systems or devices shown in the above Figures, among other devices. In various embodiments, some of the method elements shown may be performed concurrently, in a different order than shown, or may be omitted. Additional method elements may also be performed as desired. As shown, this method may operate as follows.

At 402, a test sequence may be provided, where the test sequence includes an acquisition sequence and a processing sequence. The acquisition sequence may include a sequence of acquisition functions for performing acquisitions on one or more DUTs. The processing sequence may include a sequence of processing functions for processing measurement data resulting from the acquisitions.

At 430, acquisition functions of the acquisition sequence may be performed. Performing an acquisition function may include performing an acquisition, as indicated in 432, generating a respective measurement data set, as indicated in 434, and storing the respective measurement data set in order of performance, as indicated in 436, i.e., in order of the acquisitions. In other words, the respective measurement data sets may be stored in the order in which they were acquired. Note that in some embodiments, performing an acquisition (432) produces raw data, which may be more useful in a different form. Accordingly, in some embodiments, generating the respective measurement data set (434) may include processing the raw data to a more useable or understandable form, e.g., the raw data may be scaled, smoothed, etc., as desired. As indicated by the arrow, the sequence of acquisition functions (432-436) may be repeated.

At 450, processing functions of the processing sequence may be performed. As FIG. 4 shows, performing processing functions may include retrieving a respective measurement data set in accordance with the order (of the acquisitions), as indicated in 452, and processing the respective measurement data set, also in accordance with the order, as indicated in 456. As indicated by the arrow, the sequence of processing functions (452-456) may be repeated.

As illustrated by the (horizontal) parallel lines of FIG. 4, in some embodiments, at least a portion of the sequence of processing functions of the processing sequence are performed concurrently with at least a portion of the sequence of acquisition functions of the acquisition sequence.

In some embodiments, the storing of the respective measurement data set (636) may include enqueuing the respective measurement data sets in into a queue data structure and the retrieving each respective measurement data set (452) may include dequeuing the respective measurement data sets from the queue data structure.

In another embodiment, respective metadata for each of the respective measurement data sets may be generated and may be associated with the respective metadata with each of the respective measurement data sets. In one exemplary embodiment, in order to associate the respective metadata to the respective measurement data sets, each respective measurement data set may be tagged with the respective metadata, thereby generating respective tagged measurement data sets. Additionally, the storing of the respective measurement data sets (436) may include storing the tagged measurement data sets and the retrieving of the respective measurement data sets (456) 5 may include retrieving the respective tagged measurement data sets. In some embodiments, the storing of the respective tagged measurement data sets (436) may include enqueuing the respective tagged measurement data sets into a queue data structure and the retrieving of the respective tagged measurement data sets (456) may include dequeuing the respective tagged measurement data sets from the queue data structure.

In yet another embodiment, the storing of the respective measurement data sets (436) may include, for each respective measurement data set, storing the respective measurement data set in a respective memory location, generating a reference to the respective measurement data set where the reference indicates the respective memory location and where the respective metadata includes the reference, and enqueuing the respective metadata into a queue data structure. Accordingly, the retrieving of the respective measurement data set (456) may include, for each respective measurement data set, dequeuing the metadata for the respective measurement data set from the queue data structure and retrieving the respective measurement data set from the memory location based on the reference in the metadata.

In another embodiment, the storing of the respective measurement data sets (436) may include, for each respective measurement data set, storing the respective measurement data set in a respective memory location, generating a reference to the respective measurement data set where the reference indicates the respective memory location, and enqueuing the reference to the respective measurement data set into a queue data structure. The retrieving of the respective measurement data set (456) may include, for each respective measurement data set, dequeuing the reference to the respective measurement data set from the queue data structure and retrieving the respective measurement data set from the respective memory location via the reference.

In one embodiment, regarding exemplary embodiments of the systems described above, e.g., per FIGS. 1A, 1B, 2 and/or 3, the sequence of acquisition functions may include functions for configuring acquisition hardware for each of a plurality of acquisitions and functions for performing respective acquisitions of the plurality of acquisitions, thereby generating the respective measurement data sets. In another embodiment, the functions for configuring the acquisition hardware may include a function for configuring the acquisition hardware to perform a first acquisition of the plurality of acquisitions on a first DUT of the one or more DUTs and a function for configuring the acquisition hardware to perform a second acquisition of the plurality of acquisitions on the first DUT. In yet another embodiment, the functions for configuring acquisition hardware may include a function for configuring the acquisition hardware to perform a first acquisition of the plurality of acquisitions on a first DUT of the one or more DUTs, and a function for configuring the acquisition hardware to perform a second acquisition of the plurality of acquisitions on a second DUT of the one or more DUTs.

In another embodiment, also regarding exemplary embodiments of the systems disclosed herein, the one or more processors may include a plurality of processors, where one or more first processors of the plurality of processors may perform each acquisition function of the acquisition sequence, and where one or more second processors of the plurality of processors may perform each processing function of the processing sequence. In yet another embodiment, the one or more DUTs may include a plurality of DUTs, where for at least two DUTs of the plurality of DUTs, acquisition functions of the acquisition sequence performed on each of the at least two DUTs may be performed concurrently.

In an exemplary embodiment, for the at least two DUTs, respective processors of the plurality of processors may perform acquisition functions of the acquisition sequence on each of the at least two DUTs concurrently. In other words, for each DUT, there may be a processor performing acquisition functions of the acquisition sequence on the DUT.

In another embodiment, at least one processing function of the processing sequence may be performed concurrently with at least one other processing function of the processing sequence. In some embodiments, all of the processing functions of the processing sequence are performed after the completion of all of the acquisition functions of the acquisition sequence. Note that the processing functions may be performed in the same order as the plurality of acquisitions, whether the processing functions are performed concurrently with at least a portion of the acquisition sequence or at some time after completion of the acquisition sequence. Of course, if the processing is performed after completion of the acquisition sequence, the order of processing may not affect processing results.

In one exemplary embodiment, one or more first processors of the plurality of processors may perform the acquisition functions (632-636) of the acquisition sequence. One or more second processors of the plurality of processors may perform the processing functions (652-656) of the processing sequence.

In another embodiment, also regarding exemplary embodiments of the systems disclosed herein, the test process may be a radio frequency (RF) test process, where an RF test sequence may be provided. Similar to the above test sequence, the RF test sequence may include an RF acquisition sequence and an RF processing sequence. The RF acquisition sequence may include RF acquisition functions for performing acquisitions on one or more DUTs, where the one or more DUTs may include one or more mobile wireless devices. In another embodiment, the one or more DUTs may include one or more UE devices. The RF processing sequence may include a sequence of RF processing functions for processing measurement data resulting from the acquisitions. Each RF acquisition function of the RF acquisition sequence may be performed (in or by the method), including performing a plurality of RF acquisitions, thereby generating respective RF measurement data sets, and storing the respective RF measurement data sets in order of the RF acquisitions. Each RF processing function of the RF processing sequence may be performed, including processing the respective RF measurement data sets to analyze the one or more DUTs, which may include one or more mobile wireless devices. Each respective RF measurement data set may be retrieved and processed in accordance with the order. In one embodiment, at least one RF processing function of the RF processing sequence may be performed concurrently with at least one RF acquisition function of the RF acquisition sequence. In another embodiment, all of the RF acquisition sequence functions may be completed prior to performance of any of the RF processing sequence functions.

Figure 5:
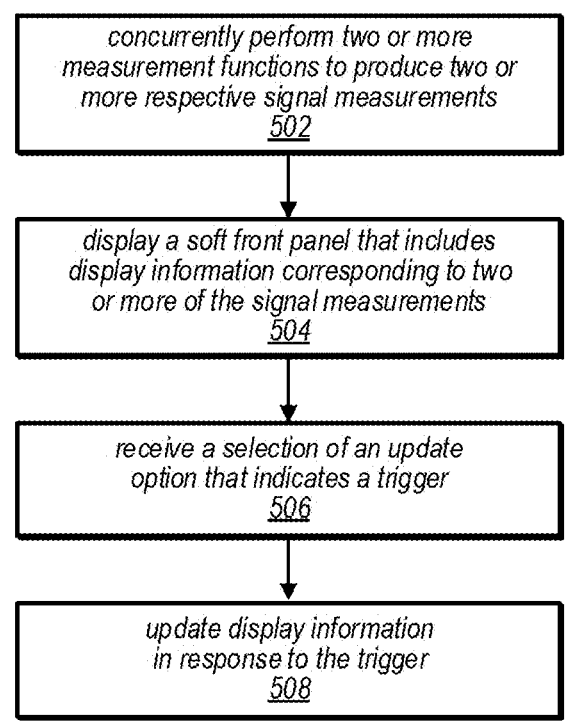
FIG. 5 is a flow chart diagram illustrating a method for displaying multiple concurrent measurements on a soft front panel, according to some embodiments.

FIG. 5—Displaying and Updating SFP for Multiple Measurements

FIG. 5 is a flowchart diagram illustrating an exemplary method for implementation by a computer system (or a measurement system) to display multiple signal measurements on a soft front panel, according to some embodiments.

At 502, a measurement device of the computer system may concurrently perform two or more measurement functions to produce two or more respective signal measurements. In some embodiments, the measurement functions may be performed on a device under test (DUT). Each measurement function, as described in detail above, may comprise an acquisition function and a processing function. In some embodiments, the two or more measurement functions may produce two or more respective signal measurements that correspond to different functional capabilities of the DUT. For example, one measurement function may measure transmission characteristics of a cellular transmitter of the DUT, while a second measurement function may measure transmission characteristics of a Wi-Fi transmitter of the DUT.

At 504, the computer system may cause the display of a soft front panel (SFP), wherein the soft front panel includes display information corresponding to two or more of the signal measurements. The SFP may be displayed on a display device of the computer system. In some embodiments, the display information corresponding to each of the two or more signal measurements may be displayed in a separate tab on the soft front panel. In some embodiments, each tab may separately identify a name and/or a configuration associated with its respective signal measurement.

In some embodiments, the computer system may compute an average value from successive results related to each of the two or more signal measurements. In these embodiments, the display information may be based on the computed average values. In some embodiments, the computed average values may comprise a running average over all of the previous measurement results, or over a predetermined number of the most recent successive results. In some embodiments, whether to use a running average and the predetermined number of most recent successive results used in the running average may be user configurable.

In some embodiments, the display information is periodically updated based on the two or more signal measurements. In some embodiments, the display information is updated at a lower frequency than a frequency at which the signal measurements are acquired (or updated). As one non-limiting example, if the signal measurements are acquired at a rate of 1 kHz, it may be difficult for a user to observe a display updating on the SFP at a rate of 1 kHz. In this case, the display information on the SFP may only update at a rate of 1 Hz (i.e., once every second) or at some other lower frequency, so that the user can more easily observe the display information. In this embodiment, because the frequency of the display update is 1000 times slower than the rate of the signal measurement, the computer system may only update the SFP with 1 out of every 1000 acquired signal measurements.

In other embodiments, the SFP may display information corresponding to the single measurements at a slower rate than they are produced. To extend the previous example where the signal measurements are acquired at a rate of 1 kHz, the SFP may have a display option to display each of the successive signal measurements at a slower rate (e.g., 10 per second, or at another rate), so that the user can observe potential rapid changes in the signal measurements at a rate that is more detectable to the human eye. It may be appreciated that in these embodiments, the SFP display will lag behind the produced signal measurements. To accommodate for this, in some embodiments the SFP may periodically (or in response to user input) jump forward to display information related to the most current signal measurements.

In some embodiments, the signal measurements may comprise an ordered set of measurement data. In some embodiments, the signal measurements may be either of raw data, processed data, or metadata generated from either raw data or processed data.

At 506, the computer system may receive a selection of an update option. In some embodiments, the selection of the update option may indicate a trigger that causes the display information to update. In some embodiments, a user of the computer system may select an update option, and the selection of an update option may be received by the computer system responsive to the selection. As described in further detail below, the update option may indicate a variety of triggers that cause the display information to update in a plurality of ways, and for a plurality of reasons.

At 508, the computer system may update the display information on the soft front panel in response to receiving an indication that the trigger has occurred. For example, as explained in further detail below, the trigger may comprise a condition that must be met in order to trigger the updating of the display information. The computer system may be configured to receive an indication that the trigger has occurred, and may update the display information on the soft front panel responsive to receiving the indication. The indication that a trigger has occurred may be received from the measurement device in response to the result of a measurement function, or it may be received responsive to user input, in various embodiments. In some embodiments, the indication that a trigger has occurred may be received responsive to a timer executing on the computer system or within the measurement device.

In some embodiments, the update option may specify a configuration setting. In these embodiments, the display information on the soft front panel may be updated to display an identifier of the specified configuration setting. In some embodiments, the selection of an update option that specifies a configuration setting may additionally alter the configuration of the measurement device to correspond to the specified setting.

Options for when a SFP is Updated

A SFP may provide options to control when the configuration and results update in the SFP and what filters to apply on the updates. According to some embodiments, the SFP (or a hard front panel) may provide options for what triggers the display to be updated. In some embodiments, a user may select an update option, which may then cause the SFP to be updated according to trigger(s) associated with the selected update option. In other words, the reasons enumerated below for updating the display may be considered 'triggers'. Examples of such options include:

1) Update on every configuration change, measurement commit, measurement initiate, and measurement complete, such that the operation of the instrument is slowed down to ensure that all the changes are visible for sufficient period of time to be readable.

2) Update on every measurement commit, measurement initiate, and measurement complete, such that the operation of the instrument is slowed down to ensure that all the changes are visible for sufficient period of time to be readable.

3) Update on every measurement initiate and measurement complete, such that the operation of the instrument is slowed down to ensure that all the changes are visible for sufficient period of time to be readable.

4) Update on every measurement complete, such that the operation of the instrument is slowed down to ensure that all the changes are visible for sufficient period of time to be readable.

5) Update periodically on measurement complete with a configurable update interval. The latest completed measurement will be used when the display is updated. Note that the update period (or the update interval) may be configurable by a user and/or may be set to a default value.

According to some embodiments, options 1-4 above may include a sub-option for whether to display per-iteration results when performing averaging in a measurement or only display the final averaged result.

Another aspect of the options presented above is to only update all of the items on a display when one or more pass/fail measurements return a fail result. The updated display may thereby display the failed measurement. This may allow a user to see only the failed measurements without significantly slowing down the program execution.

Similarly, another aspect is to have a display area where the latest measurement configuration change is displayed. For example, the display area may show a property name and the new value. This option may overcome the issue that configuration properties are not always included on the panel.

Options for Filtering What to Display on a SFP

In some embodiments, a unique result name may be applied to each of the concurrent measurement functions being performed by the measurement system. Each result name may be displayed on a tab or window related to its respective measurement function. In addition, each measurement function may be configurable to operate within a plurality of different configurations. In these embodiments, each configuration of a given measurement function may be given a signal name, which may be displayed on a tab or window related to the respective measurement function and configuration.

In some embodiments, the update option may enable filtering of one or more aspects of the signal measurements. For example, an update option may enable signal name filtering, whereby the SFP may update configuration and results only when a user specified signal name is being configured, committed, initiated, or completed. In these embodiments, a user may select an update option that includes a user specified signal name. As a result, an indication may be received by the computer system that a trigger has occurred when the user specified signal name has been configured, committed, initiated, or completed.

Additionally or alternatively, a user may select an update option to enable result name filtering. Note that a user may be required to specify a signal name when selecting an update option to enable result name filtering, because the result names may be scoped within signal names. In these embodiments, an indication that a trigger to update the display information has occurred may be received by the computer system when the user specified signal name is being configured or committed. Additionally, when the specific result name is initiated, or completed, the results may be updated.

In some embodiments, one or more measurement functions in a group of measurement functions may be associated with a particular capability of the DUT. For example, a first group of measurement functions may measure transmission properties of a cellular transmitter of the DUT (e.g., according to LTE, 3GPP, WCDMA, NR, etc), and a second group of measurement functions may measure transmission properties of a Wi-Fi transmitter (or another wireless technology). In these embodiments, a group of measurement functions that are related to a particular capability of a DUT are referred to herein as a "personality."

The measurement API (e.g., NI-RFmx) may allow a user to create multiple measurement configurations, called signal configurations, within the same personality. Each signal configuration instance holds a unique combination of signal and measurement property values. Using multiple signal configurations may allow a user to switch between different measurements configurations without configuring the measurements each time. Signal configurations may also allow a user to execute multiple configurations of the same measurement at the same time. The measurement API may create one default signal configuration per personality, wherein the default configuration is unnamed. A user may be able to create additional signal configurations.

Configurable Measurement Result Displays

In some embodiments, a single measurement function may measure a plurality of separate quantities. For example, a measurement function may measure both an amplitude and a frequency of a cellular radio transmission. A single measurement function that measures multiple separate quantities may be referred to herein as a 'composite measurement.'

According to some embodiments, a user may be allowed to preconfigure which traces and/or results may be displayed on a SFP for each measurement and/or for specific composite measurement combinations. Note that what the SFP displays may be independent of which traces and/or results are enabled in the application or which results and traces are fetched by the application. These defined configurations may be used when the user switches to a measurement or combination of measurements in the SFP or when displaying measurement results in Monitoring mode.

Overlapped Measurements Display in the SFP

A measurement API may allow another measurement to be started before the previous measurement(s) have been completed (i.e., overlapped measurements). This capability may be enabled in the API through a Named Results feature. When a user's program uses this feature, it may create some challenges for how to display the configuration and results of the measurements that are being executed in parallel. Without overlapped measurements, a SFP may typically show the current configuration of the measurement API session. With overlapped measurements, each measurement executing in parallel may have its own configuration. Overlapped measurements may complete in an order that is different than the order in which the individual measurements were initiated. Also, the measurements may complete very close to each other in time.

According to some embodiments, a user may be allowed to view the configuration and results of different overlapped measurements in separate tabs or windows of a SFP. In another embodiment, the configuration and results of different overlapped measurements may be selectable from a dropdown menu displayed within a single tab. Each tab or window (or each item in the dropdown menu) may be identified with the results name the application associated with the measurement. The user may have an option to enable this 'per named result' tab display. When this option is enabled, the measurement API may create new tabs for each named result when the results are ready to be displayed. Note that there may a configurable limit on the number of tabs. When the limit is reached, the oldest named result tab may be deleted and a new named result tab may be created for the latest named result.

Multiple Results Panels per Composite Measurements in a SFP

According to some embodiments, multiple results panels may be displayed in a SFP (e.g., multiple results panels per composite measurements for an increased number of graphs). In some RF Standards (e.g., complex RF Standards), the number of scalar and/or trace results a user may want to view (and to easily switch between) may exceed the screen real estate of a typical high resolution monitor. To address this issue, a user may be able to group selected traces and scalar results from one composite measurement into different panels with different layout. This grouping may allow the user to customize differently how each of the various traces and results are displayed (e.g., using an entire panel for a large graph with one trace and having a plurality of graphs (e.g., four graphs) on a different panel. This grouping may allow the user to group related traces and results together. A user may use tabs to choose between the panels (e.g., multiple graphs may be in the same tab).

Embodiments of the present disclosure may be realized in any of various forms. For example, in some embodiments, the disclosed techniques may be realized as a computer-implemented method, a computer-readable memory medium, or a computer system. In other embodiments, the disclosed techniques may be realized using one or more custom-designed hardware devices such as ASICs. In other embodiments, the he disclosed techniques may be realized using one or more programmable hardware elements such as FPGAs.

In some embodiments, a non-transitory computer-readable memory medium may be configured so that it stores program instructions and/or data, where the program instructions, if executed by a computer system, cause the computer system to perform a method, e.g., any of the method embodiments described herein, or, any combination of the method embodiments described herein, or, any subset of any of the method embodiments described herein, or, any combination of such subsets.

In some embodiments, a computing device may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The device may be realized in any of various forms. For example, the computer system may be a personal computer (in any of its various realizations), a workstation, a computer on a card, an application-specific computer in a box, a server computer, a client computer, a hand-held device, a mobile computing device, a tablet computer, a wearable computer, etc.

In some embodiments, a set of computers distributed across a network may be configured to partition the effort of executing a computational method (e.g., any of the method embodiments disclosed herein).

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The invention claimed is:

1. A measurement system, comprising:
    a measurement device; and
    a computer device that includes or is coupled to a display device and the measurement device, and configured to receive user input;
    wherein the measurement device is configured to concurrently perform two or more measurement functions on a device-under-test (DUT) to produce two or more respective signal measurements, wherein each measurement function comprises an acquisition function and a processing function;
    wherein the computer device is configured to:
        display information on a soft front panel on the display device corresponding to two or more of the signal measurements;
        receive, from a user, a selection of an update option, wherein the update option indicates a trigger that causes the displayed information to either update or not update; and
        responsive to receiving an indication that the trigger has occurred, display the information on the soft front panel, wherein the displayed information is updated when one of the two or more signal measurements has returned a fail result, wherein the displayed information is not updated when each of the two or more signal measurements returns a pass result.

2. The measurement system of claim 1,
    wherein the update option comprises a configuration setting; and
    wherein said updating the display information comprises displaying an identifier of the configuration setting.

3. The measurement system of claim 1,
    wherein the display information corresponding to each of the two or more signal measurements is displayed in a separate tab on the soft front panel; and
    wherein each tab separately identifies a name and configuration associated with its respective signal measurement.

4. The measurement system of claim 1, wherein the computer is further configured to:
    compute an average value from successive results related to each of the two or more signal measurements, wherein the display information is based on the computed average values.

5. The measurement system of claim 4, wherein the computed average values comprise a running average over a predetermined number of the most recent successive results.

6. The measurement system of claim 1,
wherein the display information is periodically updated based on the two or more signal measurements, wherein the display information is updated at a lower frequency than a frequency at which the signal measurements are acquired.

7. The measurement system of claim 1,
wherein the two or more signal measurements correspond to different functional capabilities of the DUT.

8. A method, comprising:
performing, by a computer system:
concurrently performing two or more measurement functions on a device-under-test (DUT) to produce two or more respective signal measurements, wherein each measurement function comprises an acquisition function and a processing function;
causing display of a soft front panel, wherein the soft front panel includes display information corresponding to two or more of the signal measurements;
receiving, from a user, a selection of an update option, wherein the update option indicates a trigger that causes the display information to either update or not update, wherein the trigger comprises a change in a configuration of one of the two or more signal measurements; and
responsive to receiving an indication that the trigger has occurred, displaying the display information on the soft front panel, wherein the display information is updated when one of the two or more signal measurements has returned a fail result, wherein the display information is not updated when each of the two or more signal measurements returns a pass result.

9. The method of claim 8,
wherein the update option enables signal name filtering.

10. The method of claim 8, the method further comprising:
computing an average value from successive results related to each of the two or more signal measurements, wherein the display information is based on the computed average values.

11. The method of claim 10, wherein the computed average values comprise a running average over a predetermined number of the most recent successive results.

12. The method of claim 11, wherein the predetermined number of most recent successive results is user configurable.

13. The method of claim 8,
wherein the display information is periodically updated based on the two or more signal measurements, wherein the display information is updated at a lower frequency than a frequency at which the signal measurements are acquired.

14. A non-transitory computer accessible memory medium that stores program instructions executable by a processor of a measurement system to:
cause a measurement device of the measurement system to concurrently perform two or more measurement functions on a device-under-test (DUT) to produce two or more respective signal measurements, wherein each measurement function comprises an acquisition function and a processing function;
display information on a soft front panel corresponding to two or more of the signal measurements;
receive, from a user, a selection of an update option, wherein the update option indicates a trigger that causes the displayed information to either update or not update, wherein the trigger comprises a change in a configuration setting of one of the two or more signal measurements; and
responsive to receiving an indication that the trigger has occurred, display the information on the soft front panel, wherein the displayed information is updated when one of the two or more signal measurements has returned a fail result, wherein the displayed information is not updated when each of the two or more signal measurements returns a pass result.

15. The non-transitory computer accessible memory medium of claim 14,
wherein said updating the display information comprises displaying an identifier of the configuration setting.

16. The non-transitory computer accessible memory medium of claim 14,
wherein the display information corresponding to each of the two or more signal measurements is displayed in a separate tab on the soft front panel; and
wherein each tab separately identifies a name and configuration associated with its respective signal measurement.

17. The non-transitory computer accessible memory medium of claim 14, wherein the program instructions are further executable to:
compute an average value from successive results related to each of the two or more signal measurements, wherein the display information is based on the computed average values.

18. The non-transitory computer accessible memory medium of claim 17, wherein the computed average values comprise a running average over a predetermined number of the most recent successive results.

19. The non-transitory computer accessible memory medium of claim 14, wherein the program instructions are further executable to:
cause the display information to be periodically updated based on the two or more signal measurements, wherein the display information is updated at a lower frequency than a frequency at which the signal measurements are acquired.

20. The non-transitory computer accessible memory medium of claim 14,
wherein the two or more signal measurements correspond to different functional capabilities of the DUT.

* * * * *